(12) United States Patent
Kameyama et al.

(10) Patent No.: US 7,432,993 B2
(45) Date of Patent: Oct. 7, 2008

(54) DISPLAY DEVICE MANUFACTURING METHOD AND DISPLAY DEVICE

(75) Inventors: Masaomi Kameyama, Tokyo (JP); Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 326 days.

(21) Appl. No.: 11/433,466

(22) Filed: May 15, 2006

(65) Prior Publication Data
US 2006/0256250 A1 Nov. 16, 2006

Related U.S. Application Data

(63) Continuation of application No. PCT/JP2004/017019, filed on Nov. 16, 2004.

(30) Foreign Application Priority Data

Nov. 18, 2003 (JP) ............................ P2003-388457
Nov. 19, 2003 (JP) ............................ P2003-389385

(51) Int. Cl.
  *G02F 1/136* (2006.01)
  *G02F 1/1333* (2006.01)
  *G02F 1/13* (2006.01)

(52) U.S. Cl. .............................. 349/43; 349/44; 349/54; 349/187

(58) Field of Classification Search ................... 349/43, 349/44, 54, 187
See application file for complete search history.

(56) References Cited

U.S. PATENT DOCUMENTS

| 6,936,912 | B2 * | 8/2005 | Akiyama et al. | 257/676 |
| 7,061,100 | B2 * | 6/2006 | Iwaki et al. | 257/706 |
| 7,180,237 | B2 * | 2/2007 | Onozuka et al. | 313/500 |
| 2005/0106768 | A1 * | 5/2005 | Onozuka et al. | 438/30 |
| 2007/0205754 | A1 * | 9/2007 | Shiau et al. | 324/158.1 |

FOREIGN PATENT DOCUMENTS

| JP | A 09-197438 | 7/1997 |
| JP | A 2004-048032 | 2/2004 |
| JP | A 2004-062152 | 2/2004 |

* cited by examiner

*Primary Examiner*—Mike Qi
(74) *Attorney, Agent, or Firm*—Oliff & Berridge, PLC

(57) ABSTRACT

A method of manufacturing a display device permits use of a high-performance and flexible substrate, without need for a high-temperature process. In a manufacturing method of an active matrix type display device having a plurality of display elements arrayed two-dimensionally, materials (SR0-SR4) of active elements are not formed by direct deposition or the like on a substrate (PL1) forming display elements, but the active elements are formed by separately forming materials of a semiconductor or the like and distributing them on the substrate. The active element materials distributed at locations except for desired locations are subjected to a process of substantially removing electrical continuity thereof so as to prevent undesired electrical continuity.

26 Claims, 19 Drawing Sheets

DISPLAY DEVICE MANUFACTURING METHOD AND DISPLAY DEVICE

TECHNICAL FIELD

The present invention relates to two-dimensional display devices used in information equipment and home electric appliances and, more particularly, to a two-dimensional display device comprised of liquid crystal display elements, electrochromic display elements, or the like, and a manufacturing method thereof.

BACKGROUND ART

A liquid crystal display or electrochromic display as a two-dimensional display device is composed of display elements (pixels) arranged in a two-dimensional array. A display brightness of each display element or the like is controlled by either of the so-called passive matrix method and active matrix method, and the active matrix method is superior in quality of image such as contrast of a displayed image and is the mainstream for large-screen and high-definition two-dimensional display devices.

In the active matrix method, it is necessary to form a control element such as a thin film transistor or thin film diode for each display element in order to control the display brightness or the like. Information such as brightnesses to be displayed in respective pixels is transmitted through one of signal lines routed in parallel with one direction of the two-dimensional array of the display elements, to the aforementioned control elements corresponding to the respective pixels, and further transmitted to one of the pixels.

In the case of the thin film transistors being used, a plurality of select lines are also formed in a direction approximately perpendicular to the signal lines. Each thin film transistors is located near one of intersections between the signal lines and the select lines, and each display element is also located near the thin film transistor, i.e., near an intersection between the signal line and the select line.

For one of the signal lines, a number of display elements are arranged along it via the thin film transistors (control elements). On the other hand, each control element is controlled in electrical continuity or electrical non-continuity by a select line arranged perpendicular to the signal lines and, by virtue of action of the select line and control element, an electric signal on a signal line at a certain time is transmitted to only one display element.

By sequentially changing the signal line to be selected at predetermined intervals of time and changing the display information such as the brightness on each signal line in synchronism therewith, it becomes feasible to display each of the two-dimensionally arrayed display elements sequentially at a predetermined brightness. On the other hand, each of the control elements not selected by a select line is in electrical non-continuity to maintain an electric signal accumulated in the display element and thus maintain the display in the predetermined brightness state.

The thin film transistors as the control elements described above are those fabricated as follows: a thin film of amorphous silicon or poly (polycrystalline) silicon is deposited on a substrate forming the display elements, and processed in part into thin film transistors.

There are also proposals on an attempt to fabricate the control elements, using semiconductor materials of predetermined rod-like single crystals or the like preliminarily formed, instead of using the semiconductor material of silicon or the like deposited on the substrate as in the prior art. This is a method of arranging the rod-like semiconductor materials on the display device in a manufacturing process, processing them into transistors, and thereby making them function as the control elements.

The method of forming the thin film of polysilicon or amorphous silicon on the substrate and processing it in part into the thin film transistors to form the active matrix display device as described above requires a thermal process in the step of depositing polysilicon or amorphous silicon, and substrate materials that can be used for the display device were limited to those with relatively high heat resistance.

Concerning the substrates for the display device, at least a substrate used on the front side needs to be transparent. Therefore, the substrate has to be transparent and have appropriate heat resistance, and therefore it was often the case that an expensive glass substrate was used.

Incidentally, in the method using the aforementioned rod-like semiconductor materials recently proposed, there is no need for directly forming the thin film of polysilicon or amorphous silicon on the semiconductor substrate, which drastically ease the requirement of heat resistance for the substrate. However, it is difficult to accurately locate the fine rod-like semiconductor materials at their respective predetermined locations among a lot of display elements.

It is then also contemplated to adopt a method of randomly scattering a number of rod-like semiconductor materials or the like formed separately, on a substrate in which a number of display pixels or pixel electrodes for display pixels, and signal lines are formed, and processing only the rod-like semiconductor materials accidentally arranged at desired locations, so as to function as transistors or the like, thereby to form the control elements. This method can form the high-quality semiconductor materials on the substrate without need for the substrate to pass through a high-temperature process and can also lead to reduction of cost of the substrate and the whole manufacturing process.

In this case, however, the rod-like semiconductor materials or the like not located at desired positions could cause electrical continuity (short circuit) between some essentially not to be brought into electrical continuity out of the plurality of signal lines and the plurality of pixel electrodes formed on the substrate, and there is thus a problem that it is difficult to manufacture a display device without any pixel defects.

DISCLOSURE OF THE INVENTION

The present invention has been accomplished in view of this problem, and a first object of the invention is to provide a display device manufacturing technology necessitating no high-temperature process for a substrate and enabling inexpensive manufacture of a display device without any pixel defects.

A second object of the present invention is to enable manufacture of an inexpensive display device, using the above manufacturing technology.

Parenthetic symbols given to respective elements in the present invention below correspond to configurations in embodiments of the present invention described later. It is, however, noted that the symbols are given by way of illustration of the elements only and do not limit the elements to the configurations of the embodiments.

A display device manufacturing method according to the present invention is a method of manufacturing a display device having a plurality of display elements (LC13, DC13) arrayed two-dimensionally, which comprises the following steps in no particular order.

1) A step of forming a plurality of pixel electrodes (C13 and others) individually connected to the respective display elements, on at least one substrate (PL1) forming the plurality of display elements.
2) A step of forming a plurality of signal lines (A03 and others) for transmitting display information to the plurality of display elements, on the substrate.
3) A step of distributing a plurality of active element materials (SR0, SR1, SR2, SR3, etc.) on the substrate.
4) A step of making at least a portion of each of desired active element materials (SR0, SR1, etc.) distributed across a predetermined signal line out of the plurality of signal lines and a predetermined pixel electrode out of the plurality of pixel electrodes, among the active element materials, serve as a control element for controlling electrical continuity between the predetermined signal line and the predetermined pixel electrode.
5) A step of substantially removing at least a portion of undesired electrical continuity being mutual electrical continuity between the plurality of signal lines, electrical continuity between the plurality of signal lines and the plurality of pixel electrodes, or mutual electrical continuity between the plurality of pixel electrodes, from at least a portion of each of undesired active element materials being the active element materials other than the desired active element materials.

The present invention described above permits signals transmitted to the plurality of pixel electrodes individually connected to the respective display elements formed on the substrate forming the display device, to be controlled by the control elements comprised of the active element materials formed separately from the substrate. Namely, the present invention eliminates the need for formation such as the deposition of the active element materials themselves on the substrate and thus eliminates the need for the substrate to be subjected to a high-temperature process for the formation.

This allows us to adopt an inexpensive substrate with low heat resistance and achieves reduction of cost of the display device.

Since the display device manufacturing method of the present invention comprises the step of substantially removing at least a portion of undesired electrical continuity being mutual electrical continuity between the plurality of signal lines, electrical continuity between the plurality of signal lines and the plurality of pixel electrodes, or mutual electrical continuity between the plurality of pixel electrodes, from at least a portion of each of the undesired active element materials other than the desired active element materials among the active element materials, it is feasible to prevent undesired electrical continuity (short circuit) at locations other than those to be brought into electrical continuity in design of the display device and to prevent occurrence of a display pixel defect.

Therefore, it becomes feasible to manufacture the display device without any pixel defect.

The step of distributing the plurality of active element materials in the present invention can include a step of randomly distributing the plurality of active element materials on the substrate.

The signal lines in the present invention can be arranged so that with respect to the pixel electrode the signal line extends along a length equal to a quarter or more of an entire peripheral length of the pixel electrode, near the pixel electrode, and around the pixel electrode.

In the display device manufacturing method of the present invention, the step of substantially removing the undesired electrical continuity due to the undesired active element materials can include a step of removing at least a portion of the undesired active element materials.

This can prevent the undesired electrical continuity due to the mutual electrical continuity between the plurality of signal lines formed on the substrate, the electrical continuity between the plurality of signal lines and the plurality of pixel electrodes, or the mutual electrical continuity between the plurality of pixel electrodes, and can prevent occurrence of a display pixel defect.

The active element materials can be those containing a rod-like semiconductor substance (SR0). An example of the rod-like semiconductor substance is silicon. A surface of the rod-like semiconductor substance may be covered by an insulating film (OX).

The rod-like semiconductor substance may be silicon and a surface thereof may be covered by silicon oxide being an insulating film.

Furthermore, the rod-like semiconductor substance can also be an n-type or p-type semiconductor.

In the display device manufacturing method of the present invention, the display elements formed on the substrate forming the display device can be transmissive display elements (transmissive elements) (LC13). This enables to manufacture a transmissive display device.

Alternatively, in the display device manufacturing method of the present invention the display elements formed on the substrate forming the display device can be reflective display elements (reflective elements) (EC13). This enables to manufacture a reflective display device.

The display elements can be, for example, liquid crystal display elements, electrophoretic display elements, electrolytic deposition type display elements, or electrochromic display elements.

In the display device manufacturing method of the present invention the step of making each of the desired active element materials serve as the control element can include a step of making each of the desired active element materials serve as a field-effect transistor.

This permits signals transmitted to the plurality of pixel electrodes individually connected to the respective display elements formed on the substrate forming the display device, to be controlled by the control elements consisting of the field-effect transistors, and enables the display device to provide high-quality display.

In the display device manufacturing method of the present invention, the step of substantially removing the undesired electrical continuity due to the undesired active element materials can include a step of making each of the undesired active element materials serve as a field-effect transistor. Then the undesired electrical continuity can be substantially removed by applying a voltage (potential) to electrically interrupt the field-effect transistors, to gate electrodes of the field-effect transistors.

This can prevent the undesired electrical continuity due to the mutual electrical continuity between the plurality of signal lines formed on the substrate, the electrical continuity between the plurality of signal lines and the plurality of pixel electrodes, or the mutual electrical continuity between the plurality of pixel electrodes, and can prevent occurrence of a display pixel defect.

In the display device manufacturing method of the present invention, a flexible substrate can also be used as at least one substrate forming the display device. This provides the display device itself with flexibility, and enables to manufacture a flexibly deformable display device.

In the display device manufacturing method of the present invention, a substrate made of an organic material can also be used as at least one substrate forming the display device. This enables reduction of weight of the display device manufactured. The use of the substrate made of the organic material can also be effective for providing the display device with flexibility.

The display device manufacturing method of the present invention can further comprise a step of connecting a film wiring member to an end of at least one substrate forming the display device. This enables supply of image signals or the like to be displayed in the display device manufactured and can substantialize a lightweight and flexible wiring member.

Next, a display device according to the present invention is one manufactured by the display device manufacturing method of the present invention described above. The present invention enables the high-performance display device to be substantialized at low cost.

According to the present invention, the control elements, which are provided between the plurality of pixel electrodes individually connected to the respective display elements arrayed two-dimensionally on at least one substrate of the display device and the signal lines for transmitting the information to be displayed in the respective display elements are made using the active element materials formed separately from the substrate; therefore, the present invention eliminates the need for the formation such as the deposition of the active element materials themselves on the substrate and eliminates the need for the substrate to be subjected to a high-temperature process for the formation.

This permits us to adopt an inexpensive substrate with low heat resistance and provides the effect of achieving reduction of cost of the display device.

Furthermore, since the present invention permits use of the substrate with low heat resistance as described above, it enables to manufacture the flexible display device with high flexibility, like the substrate of the organic material, and can also achieve reduction of weight of the display device.

Since the display device manufacturing method of the present invention is arranged to substantially remove at least a portion of the aforementioned undesired electrical continuity from at least a portion of each of the aforementioned undesired active element materials, it can prevent undesired electrical continuity (short circuit) at locations other than those to be brought into electrical continuity in design of the display device, and can prevent occurrence of a display pixel defect.

Therefore, it becomes feasible to manufacture the display device without any pixel defects.

DESCRIPTION OF REFERENCE SYMBOLS

PL1 substrate; D11-43 pixel electrodes; A01-03 signal lines; C11-43 pixel electrode margins; SR0-4 active element materials; B11-43 control electrodes; E02, 03 interrupting electrodes; B10-B40 select lines; PL2 opposing substrate.

BEST MODE FOR CARRYING OUT THE INVENTION

An example of preferred embodied forms of the present invention will be described below with reference to the drawings. The present example is an application of the present invention to manufacturing a transmissive liquid crystal display and will be described according to a sequence of manufacturing steps. It is, however, noted that the manufacturing step sequence described below is just an example and that the sequence may be changed according to need.

Figure 1:
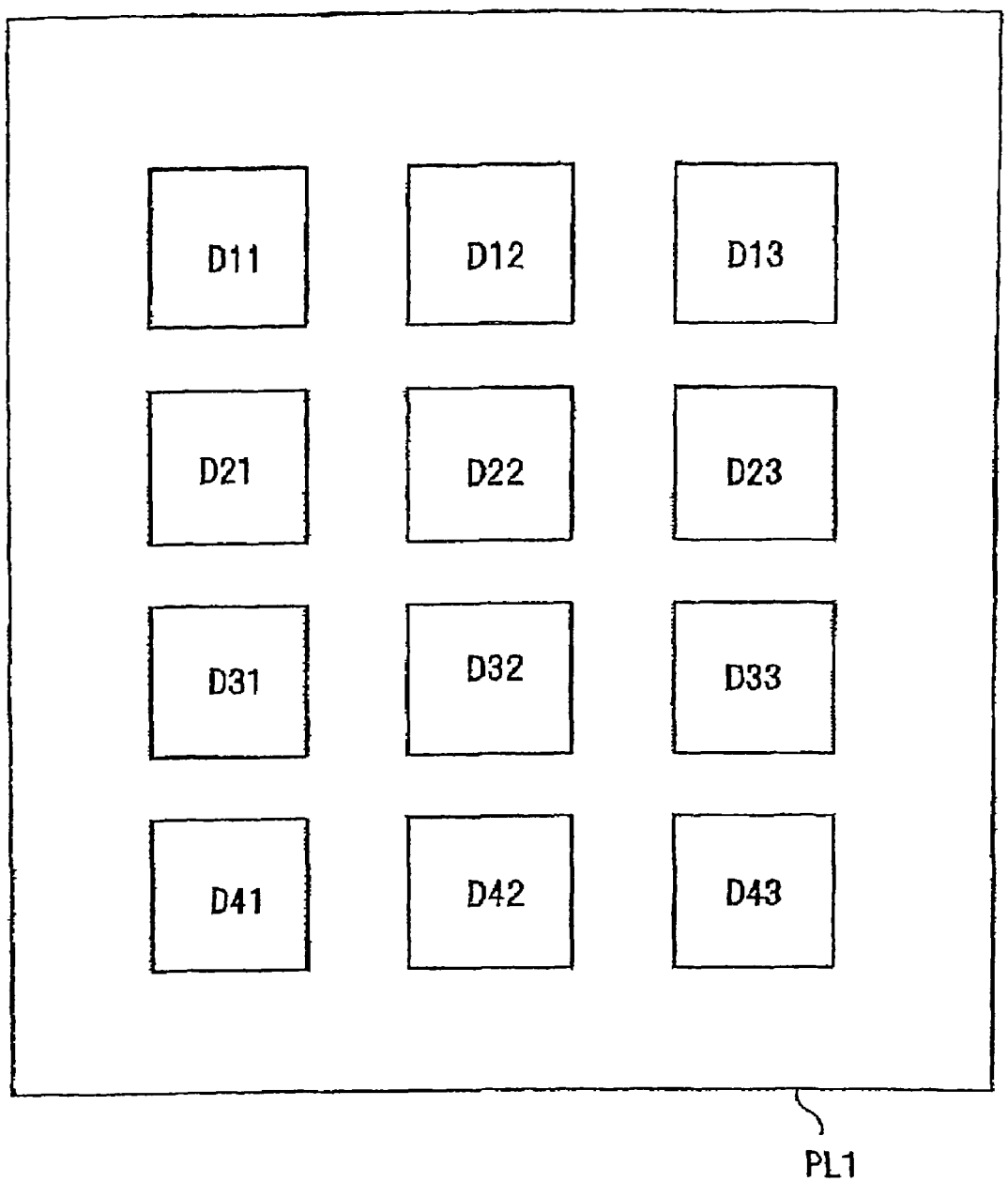
FIG. 1 is a drawing showing a state in which pixel electrodes D11-43 are formed on a substrate PL1 for display device in a manufacturing step in an embodiment of the display device manufacturing method of the present invention.

First, as shown in FIG. 1, transparent pixel electrodes D11, D12, D13, D21, D22, D23, D31, D32, D33, D41, D42, D43 are formed on a transparent substrate PL1 forming a display device such as a liquid crystal display. These pixel electrodes D11-D43 are arrayed in an orthogonal two-dimensional lattice pattern on the substrate PL1. In the sections of the following description and the brief description of the drawings, the symbols of the pixel electrodes D11-D43 will be denoted by "D11-43" for convenience' sake, and symbols of the other members will also be expressed in similar fashion.

The transparent substrate PL1 is, for example, a glass substrate, and is preferably an alkali-free glass not containing any alkali metal such as sodium, in order to prevent malfunction of transistors or the like formed in a subsequent step.

The transparent substrate PL1 may also be a transparent resin consisting of an organic material with flexibility, e.g., acrylic resin, polyester resin such as polyethylene terephthalate, or polyethylene.

The transparent pixel electrodes D11-43 are made of a metal oxide such as ITO (indium tin oxide) or tin oxide, or an electrically conductive plastic.

The pixel electrodes D11-43 can be formed in the aforementioned array by first forming the transparent electrode material over the entire surface on the substrate PL1 and performing a lithography step of exposure and etching.

On the other hand, the transparent electrode material can also be formed only in desired regions by a printing technology such as ink jet printing.

It is a matter of course that in practical display devices the number of pixel electrodes is predominantly greater than the number of pixel electrodes D11-43 shown in FIG. 1, but the description herein will be given based on the array shown in FIG. 1, for convenience sake of description.

Figure 2:
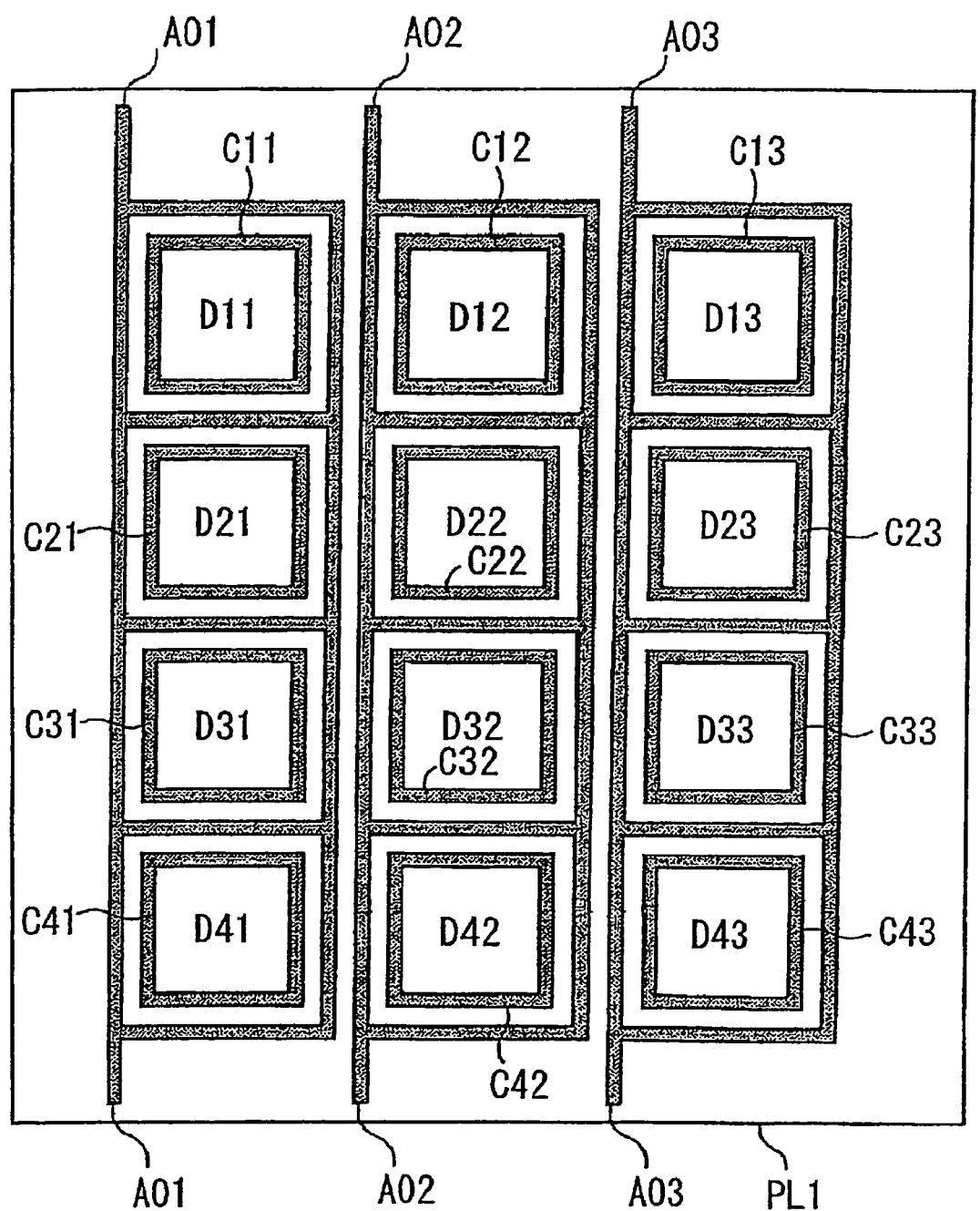
FIG. 2 is a drawing showing a state in which signal lines A01-03 and pixel electrode margins C11-43 are further formed on the substrate PL1 for display device shown in FIG. 1.

Subsequently, a step of forming signal lines A01, A02, A03 shown in FIG. 2 is carried out. In the present example, as shown in FIG. 2, in conjunction with the formation of the signal lines A01-03, pixel electrode margins C11, C12, C13, C21, C22, C23, C31, C32, C33, C41, C42, C43 are also made of the same wiring material as the signal lines A01-03 at edges of the pixel electrodes D11-43. Each of the pixel electrode margins C11-43 is formed along a periphery of one with the same reference number out of the pixel electrodes D11-43.

The signal lines A01-03 are wires for transmitting an electric signal in the vertical direction in the drawing and each of the signal lines A01-03 is arranged to surround corresponding pixel electrode margins out of the pixel electrode margins C11-43. Namely, for example, the signal line A01 is arranged to surround the pixel electrode margins D11, D21, D31, D41, as shown in FIG. 2.

The signal lines A01-03 are formed in the same forming step as the pixel electrode margins C11-43 are. This forming step may be arranged to first form a wiring material over the front surface of the substrate PL1 and to perform a lithography step of leaving only the desired shape portions while removing the other regions, or the wiring material may be formed only in the desired portions by the ink jet technology or the like.

The material suitable for the signal lines A01-03 and the pixel electrode margins C11-43 is metal such as aluminum where they are formed by the lithography step, or an organic solvent containing an electrically conductive plastic or metal fine powder, where they are formed by the ink jet technology.

The signal lines A01-03 are to be arranged as electrically isolated from the pixel electrode margins C11-43 and the pixel electrodes D11-43. Namely, the signal lines A01-03 and the pixel electrode margins C11-43 should be arranged not to overlap or contact each other, and the signal lines A01-03 and the pixel electrodes D11-43 should be arranged not to overlap or contact each other.

In the present example, the signal lines A01-03 and the pixel electrode margins C11-43 are formed in the same forming step, whereby the spacing between the two patterns can be accurately controlled. Therefore, there is no risk of contact and electrical continuity between the signal lines A01-03 and the pixel electrode margins C11-43.

However, since the signal lines A01-03 and the pixel electrodes D11-43 are formed by separate steps, it is significant to achieve alignment in pattern formation between the two steps. Therefore, a lithography apparatus (exposure apparatus) or ink jet printer used in the pattern formation needs to be equipped with an alignment mechanism.

Figure 3:
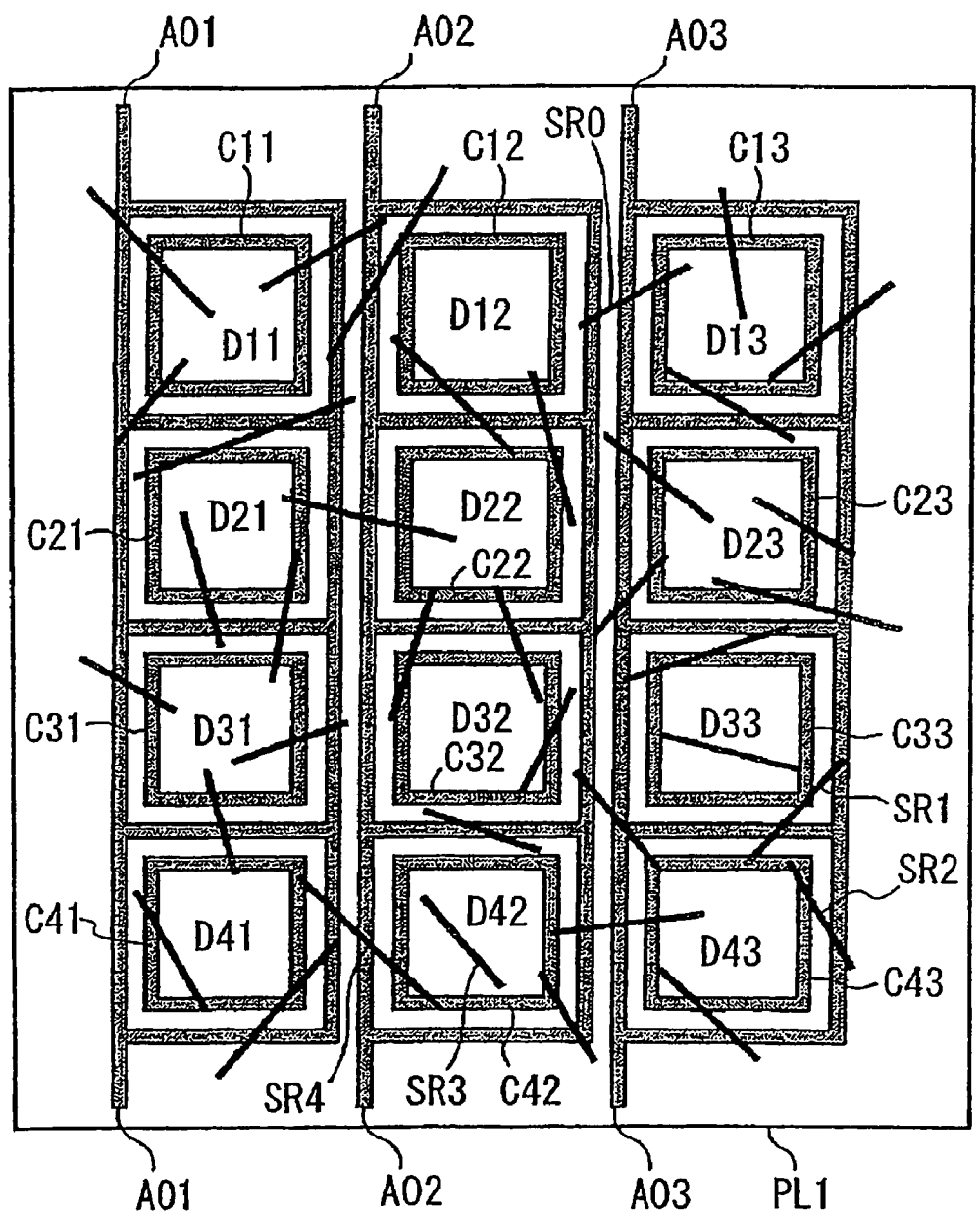
FIG. 3 is a drawing showing a state in which active element material SR0 and others are further distributed on the substrate PL1 for display device shown in FIG. 2.

As shown in FIG. 3, active element materials SR0, SR1, SR2, SR3, SR4, etc., which are one of features of the present invention, are distributed on the substrate PL1 on which the pixel electrodes D11-43, pixel electrode margins C11-43, and signal lines A01-03 are formed as described above. The active element material SR0 and others are of elongated rod-like shape as indicated by black stick shape in the drawing, and the lengths thereof range from about 5 to 100 μm. The sectional shape of the active element materials may be basically any shape, but is, for example, circular, square, hexagonal, or other shape, the thickness of which is from about 50 nm to 3 μm as a diameter or maximum diagonal length.

The active element material SR0 and others are arranged as generally distributed at random on the substrate PL1 on which the pixel electrodes D11-43, pixel electrode margins C11-43, and signal lines A01-03 are formed. As an arrangement method thereof, it is also possible to adopt, for example, a method of sprinkling the active element material SR0 and others of fine powder over the substrate PL1, or they may be arranged as sprayed onto the substrate PL1 through the intervention of an organic solvent or the like containing the active element material SR0 and others of fine powder. Another potential method is to arrange them by spin-coating the substrate PL1 with an organic solvent or the like in which the active element material SR0 and others of fine powder are mixed.

These active element materials SR0 and others are arranged on the substrate PL1, for the purpose of letting them function as transistors or the like to control electrical continuity between the pixel electrode margins C11-43 and pixel electrodes D11-43, and a predetermined one of the signal lines A01-03.

Even if we employ any one of the above-described methods, it is, however, difficult to accurately locate each of the active element material SR0 and others at a desired location on the substrate PL1, and the arrangement locations thereof inevitably become random.

For this reason, for example in FIG. 3, there is an active element material located across both of the signal line A03 and the pixel electrode margin C43 as the aforementioned desired location (hereinafter referred to as a "desired active element material"), SR2, and there also exist active element materials located at locations other than the aforementioned desired location, like an active element material SR3 located on the pixel electrode D42, an active element material SR4 located across both of the signal line A01 and signal line A02 formed adjacent to each other, and an active element material SR0 located across both of the signal line A02 and signal line A03 formed adjacent to each other.

However, the foregoing active element material SR0 is also partly a desired active element material located across both of the signal line A03 and the pixel electrode margin C13 as the aforementioned desired location. In addition, the foregoing active element material SR4 is also partly a desired active element material located across both of the signal line A01 and pixel electrode margin C41 as the foregoing desired location and across both of the signal line A02 and pixel electrode margin C42 as the desired location.

Among the active element materials SR0-4 and others, those not corresponding to the desired active element materials, and portions not corresponding thereto will be called undesired active element materials.

The following manufacturing steps will be described also using FIGS. 6 to 16 being sectional views of the substrate PL1 near the active element material SR0 in FIG. 3.

Figure 6:
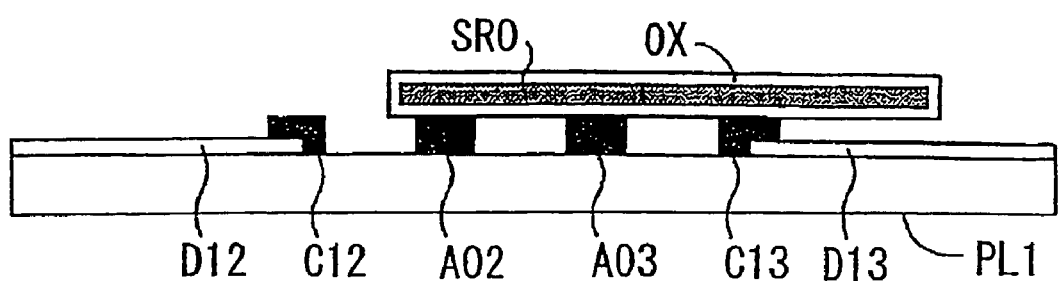
FIG. 6 is an enlarged sectional view of the substrate PL1 for display device in the state shown in FIG. 3, near an active element material SR0.

FIG. 6 is a sectional view in a state in which the active element material SR0 and others are distributed on the substrate PL1, which is the state shown in FIG. 3. As shown in FIG. 3, the active element material SR0 is located across and between the signal line A03 and the pixel electrode margin C13, and this portion serves as a desired active element material. The active element material SR0 is also located across and between the signal line A03 and the signal line A02, and this portion serves as an undesired active element material.

The present example uses a rod-like silicon single crystal as the active element material SR0, and the surface thereof is assumed to be covered by a film of silicon oxide (silicon oxide film) being an insulating film OX. It is, however, noted that the material of the active element material SR0 is not limited to this but may be another semiconductor single crystal, or a polycrystalline or amorphous semiconductor material. The surface of the active element material SR0 does not always have to be covered by the insulating film on the occasion of distributing the active element material SR0 on the substrate PL1, but the insulating film may be formed by oxidizing or nitriding the surface after the distribution on the substrate PL1.

Figure 7:
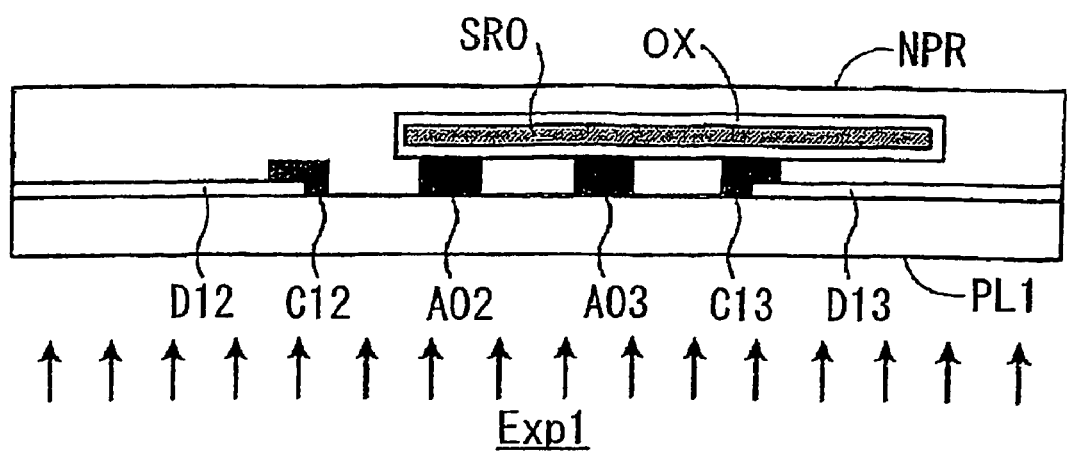
FIG. 7 is a drawing showing a state in which the substrate PL1 for display device in the state shown in FIG. 6 is coated with a photoresist NPR and the photoresist is irradiated with exposure light Exp1.

Subsequently, as shown in FIG. 7, a negative photoresist NPR is laid on the substrate PL1 in the state shown in FIGS. 3 and 6, by spraying or by spin coating. In this state the back face of the substrate PL1 is irradiated with exposure light Exp1 having a uniform intensity distribution, to expose the photoresist NPR thereto. Since the signal lines A02, A03 and pixel electrode margins C12, C13 of the aforementioned aluminum or electrically conductive plastic or the like formed on the substrate have a property of absorbing the exposure light Exp1, they induce extinction of the exposure light Exp1. For this reason, the photoresist NPR is not exposed above the mentioned portions in the drawing, and development will result in dissolving the negative photoresist NPR in the pertinent portions into a developing solution and removing it from the portions.

Therefore, after the development, the photoresist NPR is removed from the portions corresponding to the signal lines A02, A03 and the pixel electrode margins C12, C13, and the photoresist NPR remains in the other portions. At this time, the active element material SR0 can also be considered to have light shielding action, but it demonstrates no marked light shielding action if the diameter of the active element material SR0 is in the range of about 50 nm to 1 μm, because it is as thin as the wavelength of the exposure light Exp1 (about 300-500 nm). However, if the diameter of the active element material SR0 is not less than about 1 μm, it will have some light shielding action, and it is thus desirable to set an exposure amount (accumulated exposure energy) by the exposure light Exp1 to a slightly large value to effect substantial exposure of the photoresist NPR above the active element material SR0 by diffraction of light from the exposed portions around SR0, diffusion of the substance exposed in the photoresist NPR, and so on.

Figure 8:
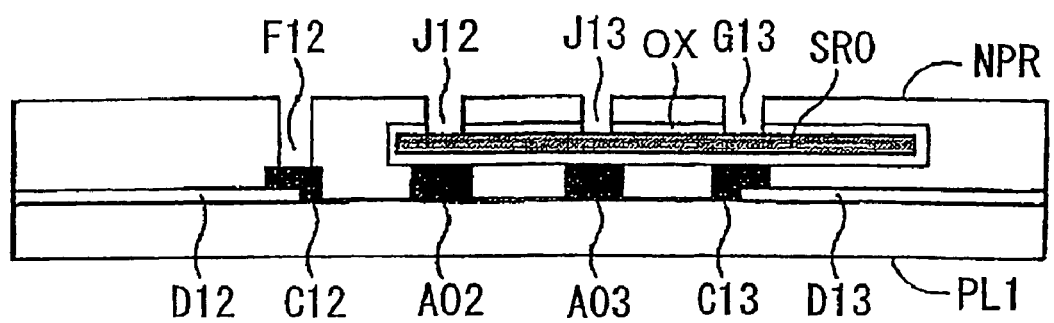
FIG. 8 is a drawing showing a state after the substrate PL1 for display device in the state shown in FIG. 7 was developed and etched.

In this state the front surface on the substrate PL1 (the upper surface in the drawing) is etched with an aqueous solution containing dilute hydrofluoric acid or fluorine ion, whereby the silicon oxide being the insulating film on the surface of the active element material SR0 is dissolved and removed in the portions corresponding to the signal lines A02, A03 and the pixel electrode margins C12, C13 from which the photoresist NPR was removed, to expose the single crystal of silicon inside the active element material, as shown in FIG. 8.

The above step was arranged to expose and pattern the photoresist NPR by the exposure from the back side using as a mask the signal lines A02, A03 and pixel electrode margins C12, C13 being a pattern formed on the substrate PL1, but it can also be replaced with an ordinary lithography step, of course. Namely, a pattern approximately corresponding to the shapes of the signal lines A02, A03 and pixel electrode margins C12, C13 is formed on a predetermined photomask, and this pattern is projected onto the photoresist NPR with an exposure apparatus to be formed therein. In this case, it is also possible to use a positive photoresist instead of the photoresist NPR, based on negative-positive inversion (inversion of bright portions and dark portions) of the mask pattern.

However, the method of performing the exposure from the back side using the existing pattern on the substrate PL1 as a mask as described above is superior in capability of forming the desired pattern at low cost.

On the other hand, the method using the ordinary lithography step is superior in capability of forming a finer pattern.

The etching of the silicon oxide film cannot be performed only by wet etching with hydrofluoric acid or the like as described above, but can also be performed by dry etching with fluorine-based gas. In this case, the wet etching is advantageous in terms of low cost, while the dry etching is advantageous in applicability to a finer pattern.

Subsequently, upper-layer signal lines A020, A030 and upper-layer pixel electrode margins C120, C130 are formed on the removed portions of photoresist NPR formed by the preceding exposure and development step, by electroplating or electroless plating. As apparent from the above manufacturing step, the upper-layer signal lines A020, A030 are formed on the signal lines A02, A03 and along the shape of them. The upper-layer pixel electrode margins C120, C130 are also formed along the shape of the pixel electrode margins C12, C13.

Figure 9:
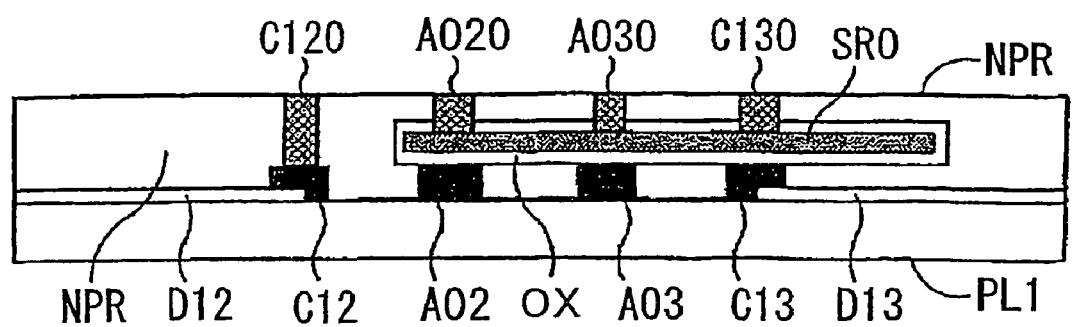
FIG. 9 is a drawing showing a state in which upper-layer pixel electrode margins C120, C130 and upper-layer signal lines A020, A030 are formed on the substrate PL1 for display device in the state shown in FIG. 8.

In FIG. 9 the upper-layer signal lines A020, A030 appear in electrical non-continuity with the signal lines A02, A03, respectively, but they are, of course, in electrical continuity in the portions other than the portion corresponding to the active element material SR0, i.e., on the near side and far side with respect to the plane of the drawing. The same also applies to the relation between the upper-layer pixel electrode margin C130 and the pixel electrode margin C13.

Therefore, display information being an electric signal transmitted through the signal line A03 is transmitted through the upper-layer signal line A030 to the active element material SR0, and is then transmitted through the upper-layer pixel electrode margin C130 and the pixel electrode margin C13 to the pixel electrode D13.

Figure 10:
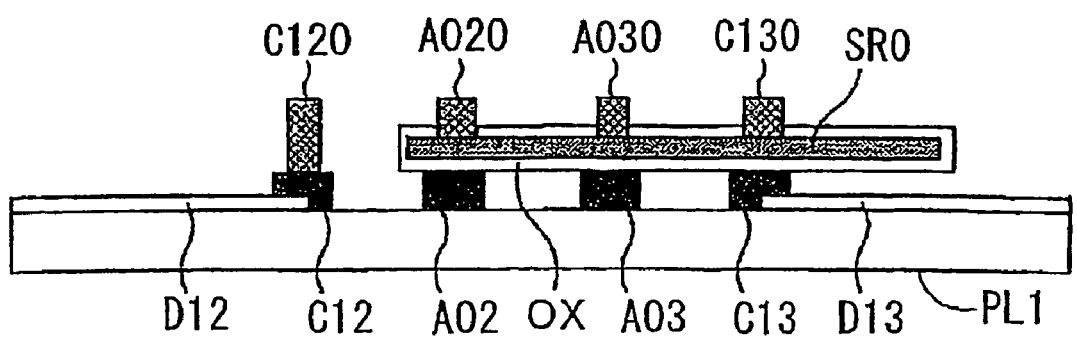
FIG. 10 is a drawing showing a state after the photoresist NPR was removed from the substrate PL1 for display device in the state shown in FIG. 9.

Subsequently, the photoresist NPR is removed from on the substrate PL1, using an organic solvent or the like. FIG. 10 shows a state after the photoresist NPR was removed.

In certain cases good electrical continuity cannot be achieved by only the foregoing electroplating or electroless plating between the upper-layer signal line A030 and the active element material SR0 and between the upper-layer pixel electrode margin C130 and the active element material SR0. In such cases, the electrical continuity can also be improved, for example, by performing laser annealing or the like, after the removal of the photoresist NPR.

Figure 11:
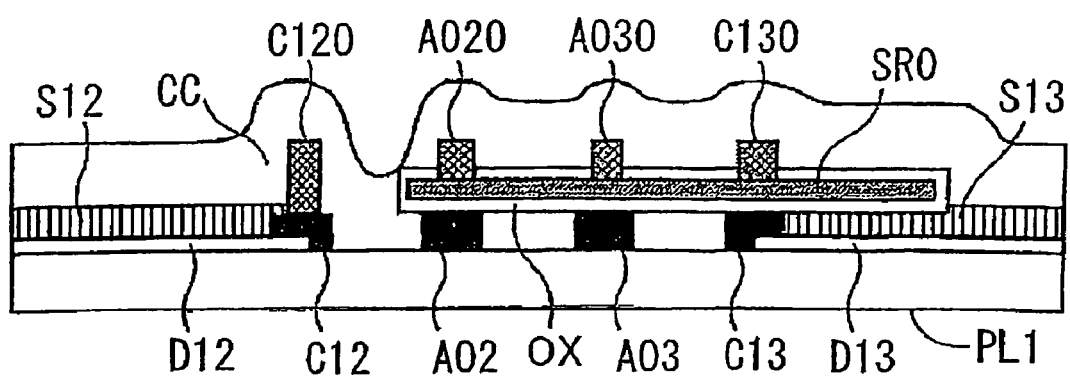
FIG. 11 is a drawing showing a state in which shield members S12, S13 and protecting film CC are formed on the substrate PL1 for display device in the state shown in FIG. 10.

Next, as shown in FIG. 11, light shielding materials S12, S13 are formed on the pixel electrodes D12, D13, etc. and thereafter a protecting film CC with an insulating property is formed on the substrate PL1. The light shielding materials S12, S13 are formed, for example, by an ink jet printer, but may be formed by forming a film over the entire surface by spray coating or by spin coating and removing the portions other than desired portions by a lithography step. The protecting film CC is formed over the entire surface on the substrate PL1 by spray coating or by spin coating.

Figure 12:
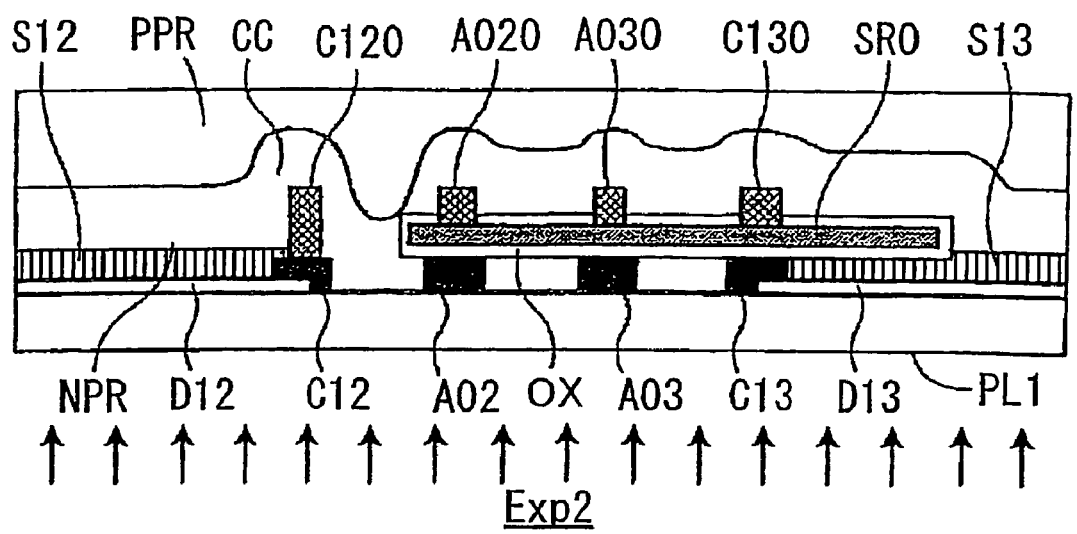
FIG. 12 is a drawing showing a state in which the substrate PL1 for display device in the state shown in FIG. 11 is coated with a photoresist PPR and the photoresist is irradiated with exposure light Exp2.

Subsequently, as shown in FIG. 12, the surface of the substrate PL1 is coated with a positive photoresist PPR by spray coating or by spin coating. Then the back side of the substrate PL1 is irradiated with exposure light Exp2 having a uniform intensity distribution, to expose the positive photoresist PPR thereto.

In this exposure step, extinction of the exposure light Exp2 also occurs at the signal lines A02, A03 and the pixel electrode margins C12, C13 formed on the substrate and at the light shielding materials S12, S13 formed on the pixel electrodes D12, D13 because they have a property of absorbing the exposure light Exp2. For this reason, the photoresist PPR is not exposed above the mentioned portions in the drawing, and the positive photoresist PPR remains without being removed in the portions with a developing solution after the development.

Figure 13:
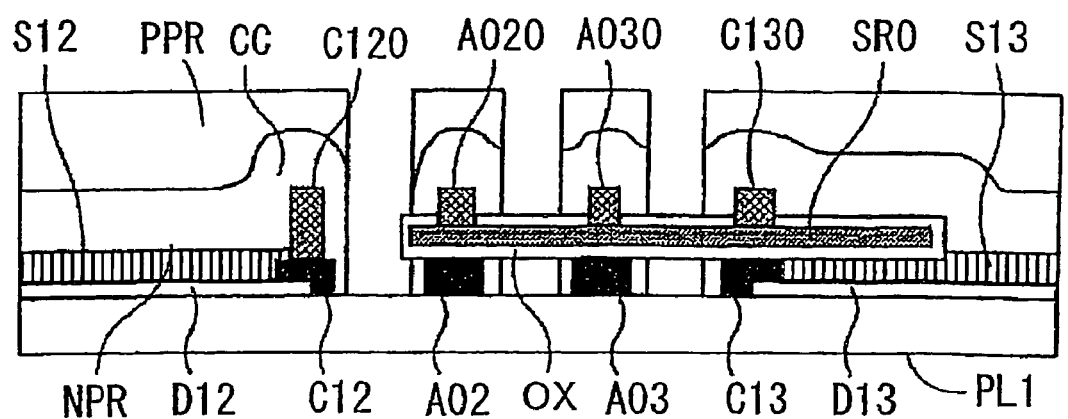
FIG. 13 is a drawing showing a state after the substrate PL1 for display device in the state shown in FIG. 12 was developed and etched.

Therefore, when the protecting film CC is etched using the photoresist PPR as a mask after the development, the protecting film CC remains at positions corresponding to the signal lines A02, A03, the pixel electrode margins C12, C13, and the light shielding materials S12, S13 formed on the substrate, while the protecting film CC is removed from the other portions, as shown in FIG. 13. At this time, the active element material SR0 is exposed in the portions from which the photoresist PPR was removed.

This exposure step is not limited to the uniform exposure from the back side of the substrate PL1, either, but may be a step of forming a photomask with a light shielding pattern in the shape corresponding to the signal lines A02, A03, pixel electrode margins C12, C13, and light shielding materials S12, S13 formed on the substrate and transferring it onto the photoresist PPR by an ordinary lithography step.

The protecting film CC can be etched either by wet etching or by dry etching.

Figure 14:
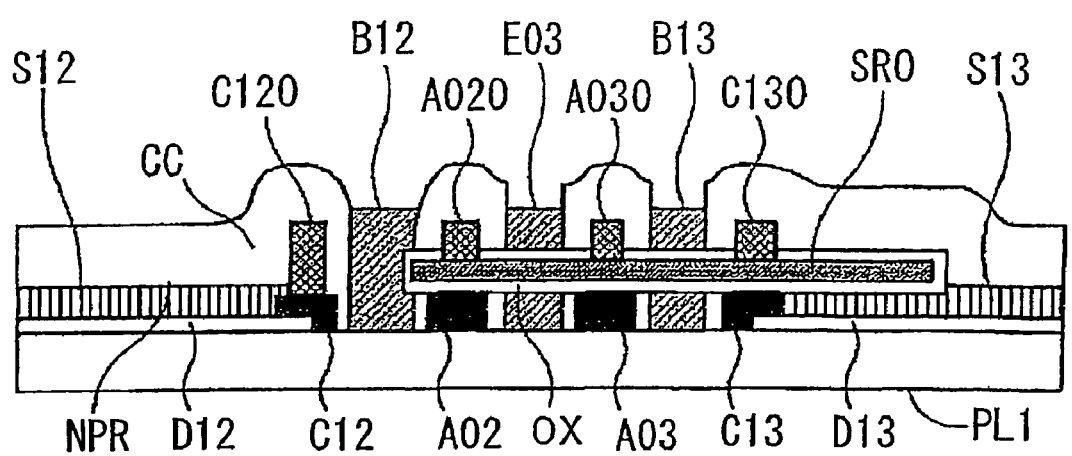
FIG. 14 is a drawing showing a state in which control electrodes B12, B13 and interrupting electrode E03 are formed on the substrate PL1 for display device in the state shown in FIG. 13.

Next, as shown in FIG. 14, control electrodes B12, B13 and interrupting electrode E03 are formed in the portions from which the photoresist PPR was removed. These electrodes are made of a metal material such as aluminum by plating such as electroless plating. It is also possible to form them by vapor deposition or sputtering of the metal.

If it is difficult to selectively form the electrodes in the portions from which the photoresist PPR was removed, the electrode material will be formed on the protecting film CC. Therefore, the electrode material formed on the protecting film CC is removed by etching with an acid or the like after the formation of the electrode material. CMP (Chemical Mechanical Polishing) can be applied to this removing step of the electrode material.

Figure 15:
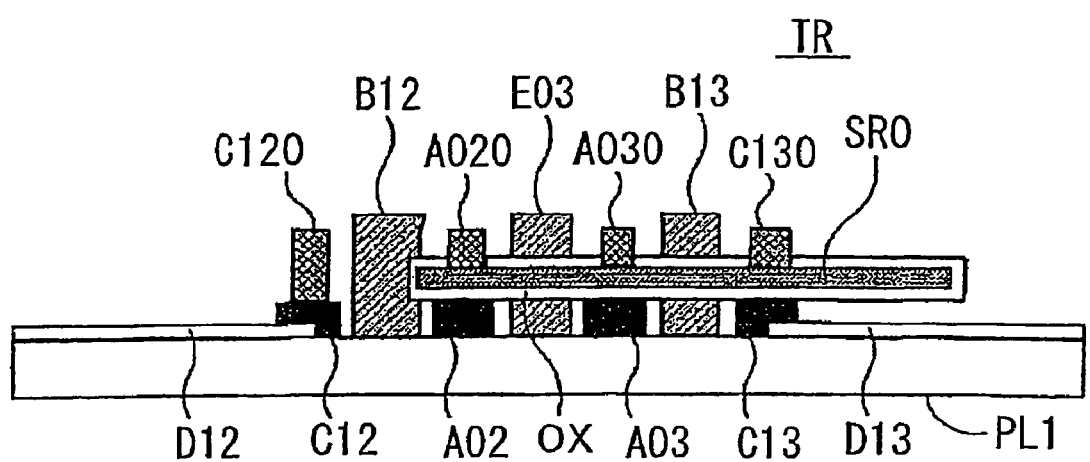
FIG. 15 is a drawing showing a state after the protecting film CC was removed from the substrate PL1 for display device in the state shown in FIG. 14.

After completion of the formation of the control electrodes B12, B13 and interrupting electrode E03 in the portions from which the photoresist PPR was removed as described above, the protecting film CC and light shielding materials S12, S13 are removed by etching or the like. FIG. 15 shows a state after the removal.

Here the control electrode B13 is formed so as to surround the active element material SR0 and the insulating film OX formed on the surface thereof. Then this configuration makes the active element material SR0 serve as a field-effect transistor TR with the control electrode B13 as a gate and with the signal line A03 and pixel electrode margin C13 as a source and a drain. Namely, it becomes feasible to control electrical continuity between the signal line A03 and the pixel electrode margin C13 by a voltage (potential) applied to the control electrode B13.

Incidentally, in order to make the active element material SR0 act as a good field-effect transistor TR, at least a portion of the active element material SR0 needs to be doped under a predetermined condition with a dopant (impurity) to change the active element material SR0 of silicon single crystal into an n-type or p-type semiconductor. However, for example, a thermal treatment at about 450° C. is needed to dope the silicon single crystal with the predetermined dopant to exhibit good electrical characteristics.

However, one of the features of the present invention is not to carry out a high-temperature process for the substrate PL1 in the manufacturing method of the display device, and it is thus preferable to avoid adopting the doping process involving the high-temperature process as much as possible.

It is thus desirable to use the active element material SR0 doped generally uniformly with the dopant and uniformly made as an n-type or p-type semiconductor before the distribution onto the substrate PL1. In this case, electrical continuity is maintained in a normal state between the signal line A03 and the pixel electrode margin C13 corresponding to the source and drain of the field-effect transistor TR formed by the active element material SR0, but the electrical continuity can be interrupted by applying the predetermined voltage (potential) to the control electrode B13 being the gate. Namely, by applying a negative voltage where the active element material SR0 is an n-type semiconductor or by applying a positive voltage where the active element material SR0 is a p-type semiconductor, the electrical continuity between the signal line A03 and the pixel electrode margin C13 can be controlled according to the applied voltage to the control electrode B13, whereby the desired active element material portion being the central portion in the drawing of the active element material SR0 can be made to act as a control element for controlling the electrical continuity.

As described above and as also apparent from FIG. 15, the left end portion in the drawing (undesired active element material portion) except for the desired active element material portion in the active element material SR0 is located across and between two signal line A02 and signal line A03, and the above process results in forming a field-effect transistor with the signal line A02 and signal line A03 as a source and a drain and with the interrupting electrode E03 as a gate. Since the active element material SR0 is preferably a uniform n-type or p-type semiconductor as described above, the signal line A02 and the signal line A03 are in electrical continuity through the undesired active element material portion of the active element material SR0 unless a predetermined voltage is applied to the interrupting electrode E03.

This electrical continuity causes a signal that should not be displayed essentially, to be transmitted as crosstalk to each display pixel (display element), and the signal degrades the quality of the display device manufactured.

In the present example, therefore, a predetermined voltage is applied to the interrupting electrode E03 to substantially remove the electrical continuity between the two signal lines A02, A03. The predetermined voltage is a negative voltage if the active element material SR0 is an n-type semiconductor, or a positive voltage if the active element material SR0 is a p-type semiconductor.

This can remove the essentially unnecessary electrical continuity caused by the active element material SR0 and prevent the degradation of the quality of the display device.

Figure 4:
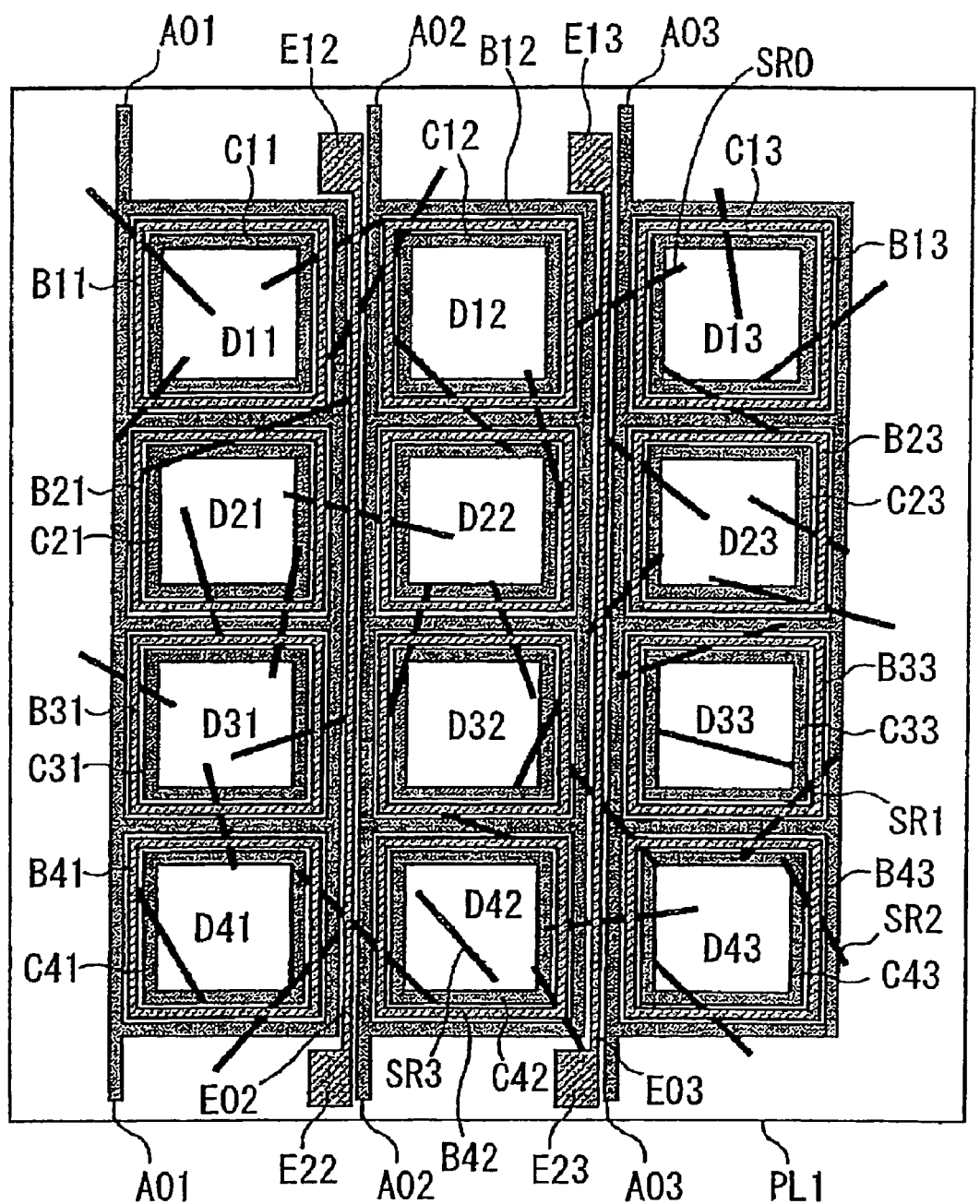
FIG. 4 is a drawing showing a state in which control electrodes B11-43 for controlling desired active element materials, and interrupting electrodes E02, E03 for removing electrical continuity of undesired active element materials are further formed, after execution of a predetermined process on the substrate PL1 for display device shown in FIG. 3.

FIG. 4 is a top plan view showing the substrate PL1 in the state shown in the sectional view of FIG. 15. It is a matter of course that a number of control electrodes B11-B43 and interrupting electrodes E02, E03 are formed corresponding to the respective pixel electrodes D11-43, in addition to those described above, on the substrate PL1. In addition, connection electrodes E12, E13, E22, E23 for facilitating connection between the interrupting electrodes E02, E03 and after-described driving circuits are also formed at the upper ends and at the lower ends of the interrupting electrodes E02, E03.

Concerning each of the active element materials SR1, SR2 and others, the portion thereof (desired active element material) located across the signal line A01-03 and the pixel electrode margin C11-43 is processed as a control element being a field-effect transistor with the control electrode B11-B43 as a gate, and the portion thereof (undesired active element material) located across a plurality of signal lines A01-03 is processed as a field-effect transistor with the interrupting electrode E02, E03 as a gate to substantially remove electrical continuity between the two signal lines.

Figure 5:
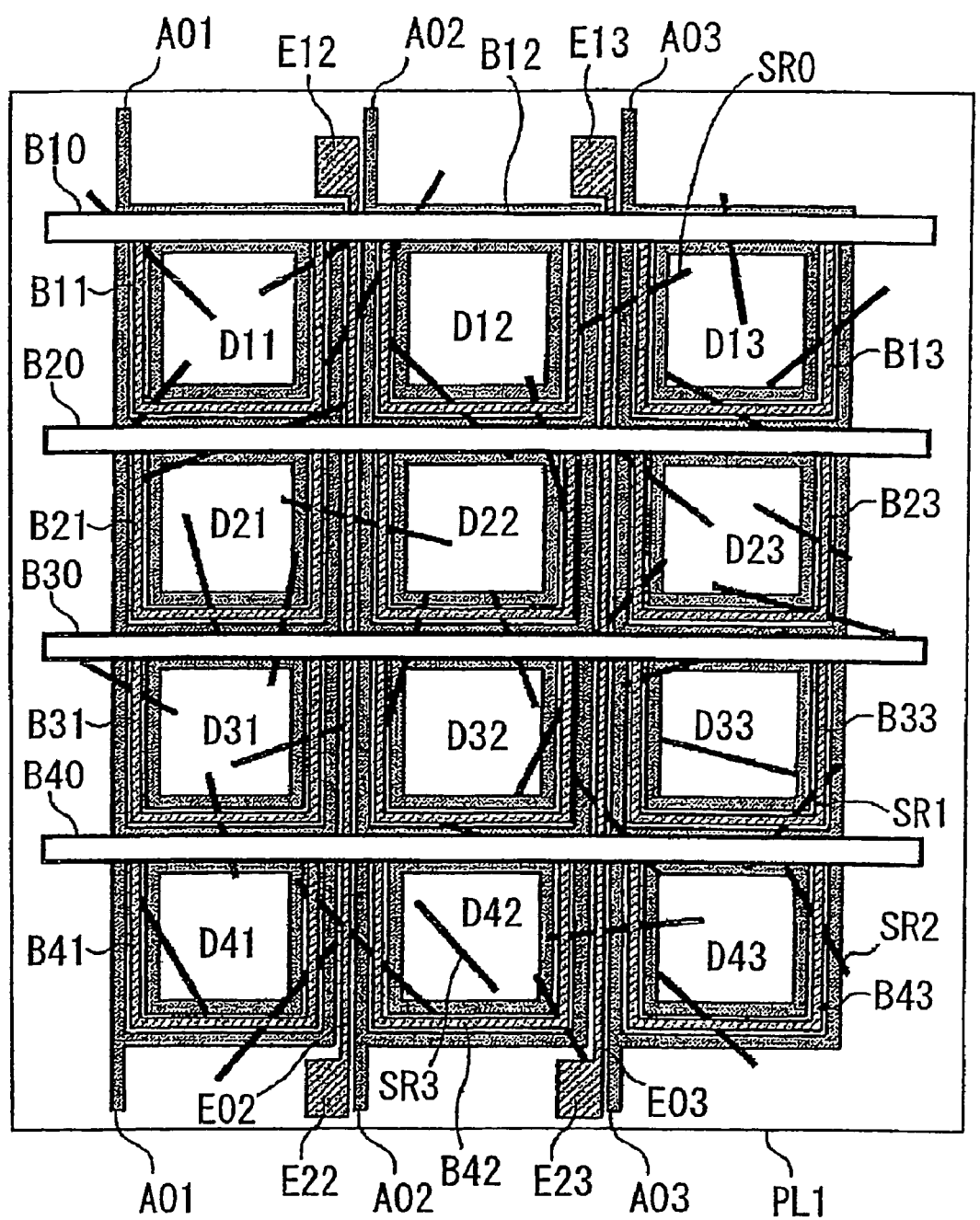
FIG. 5 is a drawing showing a state in which select lines B10-40 are formed on the substrate PL1 for display device shown in FIG. 4.

Subsequently, as shown in FIG. 5, select lines B10, B20, B30, B40 are formed on the substrate PL1 shown in FIG. 4. Among these, the select line B10 is electrically connected to the control electrodes B11, B12, and B13 out of the control electrodes B11-B43 and is electrically isolated from the other signal lines A01-03 and interrupting electrodes E02, E03. Each of the other select lines B20-40 is also arranged in similar fashion; each select line is electrically connected to only the control electrodes located immediately below the select line B20-40 of interest out of the control electrodes B21-B43, and is electrically isolated from the other signal lines A01-03 and interrupting electrodes E02, E03.

This enables the following operation: for example, if the active element material SR0 is an n-type semiconductor, a positive or null voltage is applied only to the select line B10 and a negative voltage to the other select lines B20-40, whereby the positive or null voltage is applied to only the control electrodes B11-13 associated with the select line B10, and the negative voltage to the control electrodes B21-43 associated with the other select lines B20-40. In consequence, it becomes feasible to provide only the control elements consisting of the active element materials (the central portion of the active element material SR0 and others) controlled by the control electrodes B11-13, with electrical continuity and to interrupt electrical continuity of the control elements associated with the other select lines B20-40 (the control elements consisting of the active element material SR2 and others).

In this state predetermined display information (electric signal) is then transmitted through the signal lines A01-03, whereby the display information can be transmitted to only the pixel electrodes D11, D12, D13 corresponding to the respective signal lines A01, A02, A03.

While sequentially changing the select line to which the positive or null voltage is applied, the display information to be transmitted through the signal lines A01-03 is changed in synchronism therewith, whereby the display information can be sequentially transmitted to all the pixel electrodes D11-43 on the substrate PL1.

The above steps complete the manufacture of the signal lines A01-03, select lines B10-40, pixel electrodes D11-43, pixel electrode margins C11-43, control electrodes B11-B43, interrupting electrodes E02, E03, active element materials, and control element SR0 and others formed on the single substrate.

The order of these manufacturing steps is not limited to that in the above embodiment but they may also be formed in another order, of course. The above embodiment was arranged to form the signal lines A01-03 and the pixel electrode margins C11-43 in the same forming step, but they can also be formed by separate steps.

The above embodiment involved the same forming step as the step of making the portions corresponding to the desired active element materials serve as the control elements out of the active element material SR0 and others and the step of substantially removing the electrical continuity from the portions corresponding to the undesired active element materials, but these can also be formed by separate steps.

The step of substantially removing the electrical continuity from the portions corresponding to the undesired active element materials can also be conducted, for example, by actually removing the materials corresponding to the undesired active element materials among the active element material SR0 and others and removing the portions corresponding thereto. This can be performed, for example, by distributing the active element material SR0 and others on the substrate PL1 as shown in FIG. 3, thereafter forming a protecting film at only locations corresponding to the desired active element materials, i.e., at only the portions on the signal lines A01-03, on the pixel electrode margins C11-43, and between them by a lithography step, and removing the active element materials distributed in the portions without this protecting film (the left end of the active element material SR0, the active element material SR3, etc.) by etching.

Where the undesired active element materials are actually removed in this manner, there is no need for formation of the interrupting electrodes E02, E03 described above.

Incidentally, the above embodiment was arranged to locate the signal lines A01-03 and the pixel electrode margins C11-43 so as to surround the periphery of the pixel electrodes D11-43, and a reason for it is as follows: when they are arranged so as to surround the entire periphery of the pixel electrodes D11-43, the length can be increased in the portions proximate to the pixel electrode margins C11-43 and the signal lines A01-03, and it is thus effective in distributing the active element material SR0 and others securely between the desired signal lines A01-03 and pixel electrode margins C11-43.

However, the arrangement and shape of the signal lines A01-03 and the pixel electrode margins C11-43 is not limited to this. Namely, the pixel electrode margins C11-43 can also be formed only in the left marginal regions of the pixel electrodes D11-43, and in conjunction therewith, the signal lines A01-03 can also be formed in a simple linear shape (rod shape) extending vertically, and in the vicinity of each pixel electrode D11-43.

In this case, a probability of locating the active element material SR0 and others and making them as control elements by subsequent processing is approximately a quarter of that where the pixel electrode margins C11-43 and signal lines A01-03 are formed so as to surround the periphery of the pixel electrodes D11-43 as described above.

This results in increasing the electric resistance to approximately four times in transmission of the display information from the signal lines A01-03 to each pixel electrode D11-43, but it is also possible to adopt the configuration wherein the pixel electrode margins C11-43 are located, for example, at only the left ends of the pixel electrodes D11-43 if the increase of the resistance value is permitted in view of the overall performance of the display device.

In this case, the active element material SR0 and others could bring about electrical continuity in the vertical direction in the drawing of FIG. 3 and others between the pixel electrode margins C11-43 or between the pixel electrodes D11-43. It is thus desirable to form interrupting electrodes like the aforementioned interrupting electrodes E02, E03, along spaces in the vertical direction between the pixel electrode margins C11-43 and the pixel electrodes D11-43 and substantially remove the electrical continuity of the active element material SR0 and others, or to remove the active element materials distributed in such portions by a lithography step of removing the above undesired active element materials.

Subsequently, a method of forming display elements in the present embodiment will be described.

Figure 16:
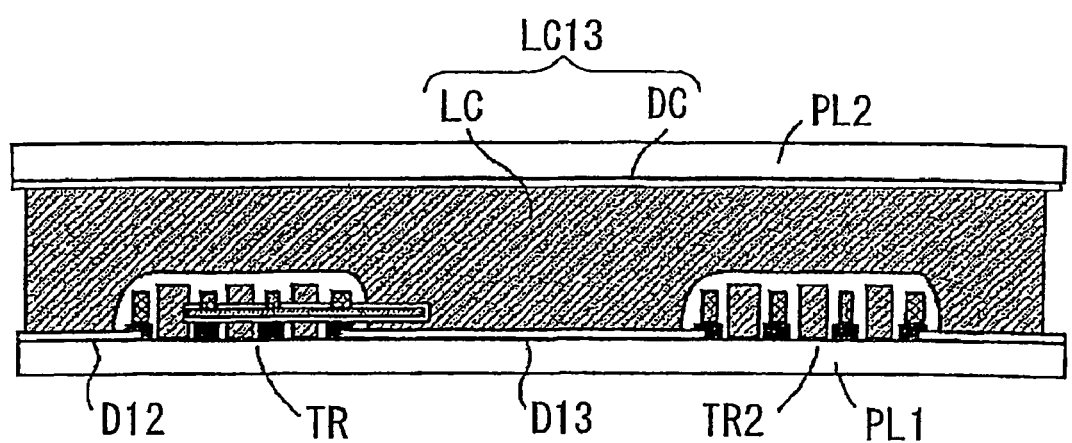
FIG. 16 is a drawing showing a manufacturing method of a liquid crystal display device in an embodiment of the display device manufacturing method of the present invention.

FIG. 16 shows an example of a case where a liquid crystal display device is formed using the substrate PL1 after completion of the manufacturing steps of the signal lines A01-03, select lines B10-40, pixel electrodes D11-43, pixel electrode margins C11-43, control electrodes B11-43, interrupting electrodes E02, E03, the active element materials, and the control element SR0 and others formed on the single substrate shown in FIG. 5.

FIG. 16 is a drawing showing an enlarged cross section near the pixel electrode 13.

A protecting film is formed in the regions corresponding to field-effect transistors TR, TR2 on the substrate PL1, and thereafter a opposing substrate PL2 with a uniform opposing electrode DC thereon is located opposite to the substrate PL1 with a predetermined clearance. Then a liquid crystal material is filled between the two substrates.

In this case, a display element corresponding to one pixel electrode D13 is mainly composed of the pixel electrode D13 and opposing electrode DC, and the liquid crystal material LC interposed between them.

Where the liquid crystal display device is of a transmissive type, the two substrates PL1, PL2 are made of a transparent material, of course. The opposing electrode DC is also made as a transparent electrode such as ITO on the substrate PL2. Then polarizing plates or polarizing films are formed below the substrate PL1 and above PL2 to complete a transmissive liquid crystal display element LC13. In the same manner the transmissive liquid crystal display elements are also completed at the locations corresponding to the other pixel electrodes D11-43.

By selective transmission of display information (electric signal) to the pixel electrode D11-43 as described above, it becomes feasible to provide display at a predetermined transmittance (brightness) or the like in the liquid crystal display element LC13 corresponding to the predetermined pixel electrode D11-43.

It is also possible to form a color filter on the substrate PL1 or on the opposing substrate PL2 according to need to form a liquid crystal display device that can provide color display.

For example, if the opposing electrode DC is made of a metal film or the like with a high reflectance in FIG. 16, the display device can be a reflective liquid crystal display device in which light is incident from the substrate PL1 side and emerges from the substrate PL1 side. Where the pixel electrodes D11-43 are made of a metal film or the like with a high reflectance, the display device can also be a reflective liquid crystal display device in which light is incident from the opposing substrate PL2 side and emerges from the opposing substrate PL2 side.

Next, a method of forming electrochromic display elements will be described using FIGS. 17 and 18.

Figure 17:
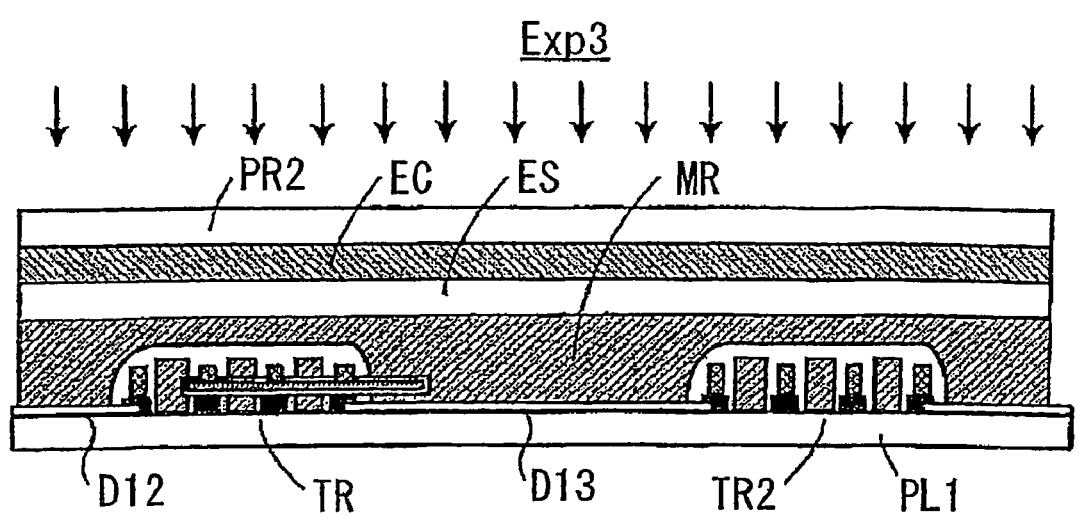
FIG. 17 is a drawing showing a manufacturing method of an electrochromic display device in an embodiment of the display device manufacturing method of the present invention.

FIG. 17 shows a state in which a reflecting film MR with a high reflectance made of metal, e.g., aluminum is formed on the substrate PL1 after completion of the manufacturing steps of the signal lines A01-03, select lines B10-40, pixel electrodes D11-43, pixel electrode margins C11-43, control electrodes B11-B43, interrupting electrodes E02, E03, the active element materials, and the control element SR0 and others formed on the single substrate shown in FIG. 5, an electrolyte ES such as antimony oxide ($Sb_2O_5$) is formed thereon, an electrochromic material EC such as tungsten oxide ($WO_3$) is formed thereon, and a photoresist PR2 is applied thereonto. FIG. 17 is also an enlarged sectional view near the pixel electrode D13.

This is irradiated with exposure light Exp3 having a predetermined intensity distribution, by a lithography step, to leave the photoresist PR2 in the portions corresponding to the pixel electrodes D11-43, precisely, in portions a little larger than them, and to remove the photoresist PR2 from the other portions. Thereafter, the electrochromic material EC, electrolyte ES, and reflecting film MR are etched using the photoresist PR2 as a mask. Then the portions removed by etching are filled with insulating members FS1, FS2 and thereafter an opposing substrate PL2 with a transparent electrode DC thereon is placed above the substrate PL1.

This completes a reflective electrochromic display element EC13 and others, and an electrochromic element EC13 corresponding to a predetermined pixel electrode D11-43 can be displayed at a predetermined reflectance (brightness) or the like by selective transmission of display information (electric signal) to the pixel electrode D11-43.

Since the electrochromic display elements can also be used in the transmission type as the liquid crystal display elements, a transmissive electrochromic display device can also be manufactured by adopting a transparent electrode instead of the aforementioned reflecting film MR with the high reflectance, or by using the transparent pixel electrodes D11-43 themselves as the electrodes of the display elements, instead of using the transparent electrode.

Next, a method of forming electrolytic deposition type display elements and electrophoretic display elements will be described.

Figure 18:
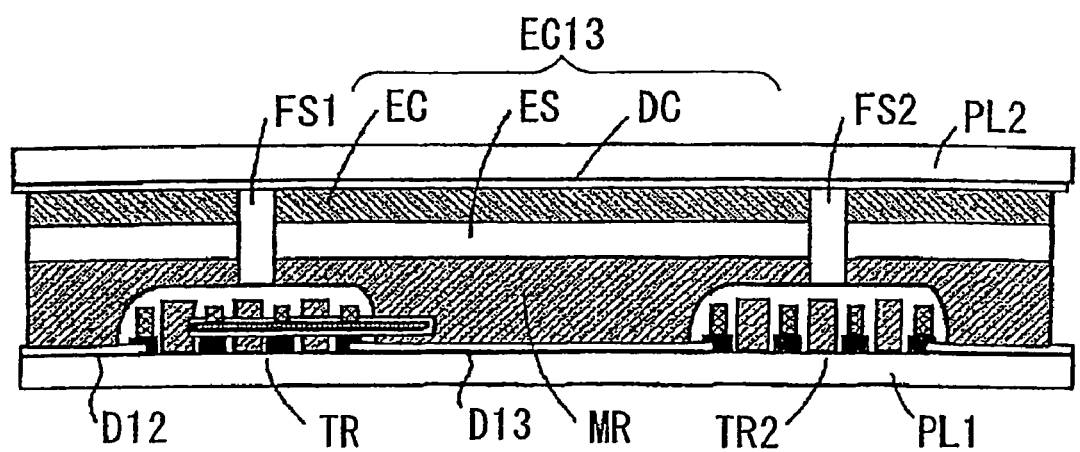
FIG. 18 is a drawing showing a manufacturing method of an electrochromic display device, electrolytic deposition type display device, and electrophoretic display device in an embodiment of the display device manufacturing method of the present invention.

The method will be described with FIG. 18, but each of components in FIG. 18 is different from that in the embodiment of the electrochromic display device described above.

Where the display elements in the display device of the present invention are constructed of electrolytic deposition type display elements, the reflecting film MR with the high reflectance in FIG. 18 is made of silver (Ag). A transparent electrode DC is formed on the opposing substrate PL2 and a transparent electrode EC is further formed thereon. However, the transparent electrode EC can be omitted depending upon circumstances. In this example, spaces FS1, FS2 made by patterning of the reflecting film MR do not have to be filled with an insulating material.

Then the substrate PL1 and the opposing substrate PL2 are arranged in proximity and a solution containing silver ion is filled in the clearance ES between them and in the foregoing spaces FS1, FS2. This completes electrolytic deposition type display element EC13.

When a positive charge is injected through the signal line A03 into the pixel electrode D13, silver turns into silver ion and the silver ion dissolves from the reflecting film MR into the solution in the spaces ES, FS1, FS2. On the other hand, silver ion turns into silver to extract on the opposed transparent electrode EC. The silver extracted on the transparent electrode EC decreases transparency of the transparent electrode EC to result in decreasing the reflectance of the electrolytic deposition type display element EC13.

On the other hand, when a negative charge is injected through the signal line A03 into the pixel electrode D13, the silver extracted on the transparent electrode EC again turns into silver ion to dissolve into the solution in the spaces ES, FS1, FS2. On the other hand, silver ion turns into silver to extract on the reflecting film MR. This decreases the silver extracted on the transparent electrode EC to recover the transparency of the transparent electrode EC and to increase the reflectance of the electrolytic deposition type display element EC13.

The decrease and increase of the reflectance of the electrolytic deposition type display element EC13 as described above are reversible, and the decrease and increase of reflectance can be repeated any number of times, which can be applied to the display elements and display element devices.

In the present invention, a manufacturing method in a case where the display elements are electrophoretic display elements, is much the same as the manufacturing method of the electrolytic deposition type display elements: however, the liquid filled between the two substrates is not the silver ion solution, but is, for example, a liquid containing carbon particles or titanium oxide particles. In addition, the material of the reflecting film MR with the high reflectance is not limited to silver, but may be another metal material such as aluminum.

Incidentally, the display device itself formed by one of the above methods has no processing and generating function of display information, and, in order to operate the display device, it is necessary to provide driving circuits for feeding the display information (electric signals) and select signals.

Figure 19:
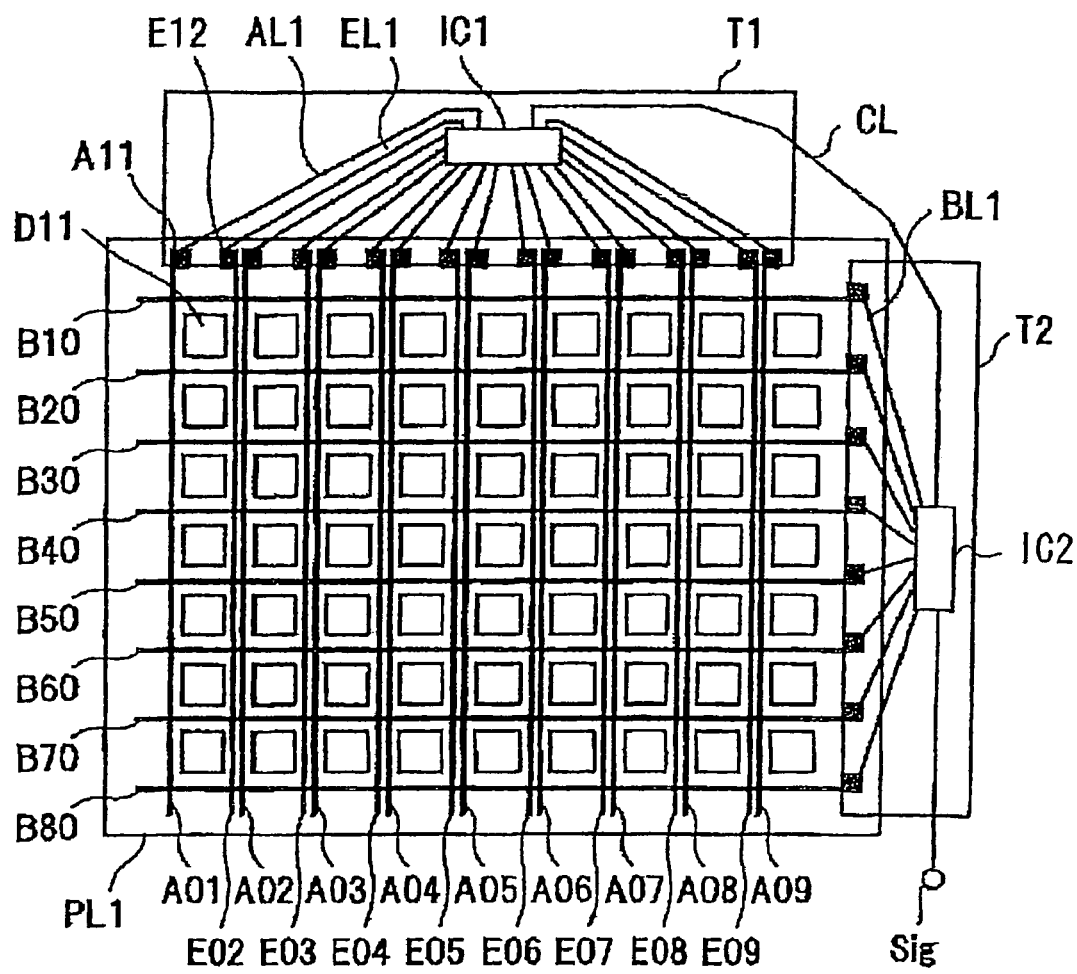
FIG. 19 is a drawing showing an example of a method of forming driving circuits in a display device of an embodiment of the present invention.

FIG. 19 is a drawing showing an example of a method of forming driving circuits, and shows a view in which driving circuits IC1, IC2 for feeding the display information (electric signals) and select signals through the electrode parts A11, B01, E12, etc. at the ends are formed on the substrate PL1 on which the display device is formed by the above manufacturing method.

Each of the driving circuits IC1, IC2 is an integrated circuit mounted on a base material T1 or T2 of a flexible film form, and wiring patterns AL1, BL1, etc. are formed on the respective base materials T1, T2 of the film form to constitute film wiring members.

The wiring pattern AL1 or the like is connected through the electrode part A11 or the like on the substrate PL1, to the signal line A11 or the like. The wiring pattern BL1 or the like is connected through the electrode part B01 or the like on the substrate PL1, to the signal line B10 or the like. The wiring patterns AL1, BL1 are connected to the respective integrated circuits IC1, IC2, and an image signal Sig from the outside is connected to the integrated circuit IC2.

The integrated circuit IC2 generates select signals on the basis of the image signal Sig and applies a predetermined voltage through the wiring pattern BL1 and others to the select line B10 and others in the display device. The integrated circuit IC2 transmits the image signal Sig or part thereof through an interconnection CL to the integrated circuit IC1, and the integrated circuit IC1 generates display signals on the basis of the signal and transmits predetermined display information (electric signals) through the wiring pattern AL1 and others to the signal line A01 and others in the display device.

The integrated circuit IC1 supplies a predetermined voltage (potential) through the wiring pattern EL1 and through the electrode E12 and others on the substrate PL1 to the interrupting electrode E02 and others on the substrate PL1 as occasion may demand.

The above embodiments adopted the active element material SR0 and others made of the semiconductor, but the active element materials do not have to be limited to it; for example, it is also possible to use those of conductors such as metals and metal oxides, and organic substances. The transistors can also be constructed using the organic substances in the same manner as in the above embodiments.

Where the conductors such as metals or metal oxides are used, diodes can be constructed. Namely, different types of metals or semiconductors are deposited as thin films on a surface of each of metallic active element materials and they can be made to serve as diodes by making use of the rectifying characteristic between the different types of metals or the rectifying characteristic occurring between metal and semiconductor. This allows us to construct the active display elements using back-to-back diodes, for example.

It is noted that the present invention is by no means limited to the above-described embodiments but can be modified definitely in a variety of configurations without departing from the spirit and scope of the present invention. The whole disclosures of Japanese Patent Application No. 2003-388457 filed Nov. 18, 2003 and Japanese Patent Application No. 2003-389385 filed Nov. 19, 2003 including the specification, scope of claims, drawings, and abstract are incorporated herein by reference in their entireties.

INDUSTRIAL APPLICABILITY

The display device manufacturing method of the present invention eliminates the need for forming the semiconductor thin film on the substrate to be used in the display device, and thus permits to manufacture the display device without passage through a high-temperature process. For this reason, it becomes feasible to adopt an inexpensive substrate with low heat resistance and to achieve reduction of cost of the display device.

The display device manufacturing method of the present invention prevents undesired electrical continuity (short circuit) at locations other than those to be brought into electrical continuity in design of the display device, and prevents occurrence of a display pixel defect.

Therefore, it is feasible to manufacture the display device without any pixel defects.

The invention claimed is:

1. A method of manufacturing a display device having a plurality of display elements arrayed two-dimensionally, the display device manufacturing method comprising:
a step of forming a plurality of pixel electrodes individually connected to the respective display elements, on at least one substrate forming the plurality of display elements;
a step of forming a plurality of signal lines for transmitting display information to the plurality of display elements, on the substrate;
a step of distributing a plurality of active element materials on the substrate;

a step of making at least a portion of each of desired active element materials distributed across a predetermined signal line out of the plurality of signal lines and a predetermined pixel electrode out of the plurality of pixel electrodes, among the active element materials, serve as a control element for controlling electrical continuity between the predetermined signal line and the predetermined pixel electrode; and a step of substantially removing at least a portion of undesired electrical continuity being mutual electrical continuity between the plurality of signal lines, electrical continuity between the plurality of signal lines and the plurality of pixel electrodes, or mutual electrical continuity between the plurality of pixel electrodes, from at least a portion of each of undesired active element materials being the active element materials other than the desired active element materials.

2. The display device manufacturing method according to claim 1, wherein the step of distributing the plurality of active element materials includes a step of randomly distributing the plurality of active element materials on the substrate.

3. The display device manufacturing method according to claim 1, wherein the signal lines are arranged so that with respect to the pixel electrode, the signal line extends along a length equal to a quarter or more of an entire peripheral length of the pixel electrode, near the pixel electrode, and around the pixel electrode.

4. The display device manufacturing method according to claim 1, wherein the signal lines are arranged so that with respect to the pixel electrode, the signal line extends along a length equal to a quarter or more of an entire peripheral length of the pixel electrode, near the pixel electrode, and around the pixel electrode, and wherein the step of distributing the plurality of active element materials includes a step of randomly distributing the plurality of active element materials on the substrate.

5. The display device manufacturing method according to claim 1, wherein the step of substantially removing the undesired electrical continuity from the undesired active element materials includes a step of removing at least a portion of each of the undesired active element materials.

6. The display device manufacturing method according to claim 1, wherein the active element materials contain a rod-like semiconductor substance.

7. The display device manufacturing method according to claim 6, wherein the rod-like semiconductor substance is silicon.

8. The display device manufacturing method according to claim 6, wherein the rod-like semiconductor substance is silicon and a surface thereof is covered by silicon oxide.

9. The display device manufacturing method according to claim 6, wherein the step of distributing the plurality of active element materials includes a step of randomly distributing the plurality of active element materials on the substrate.

10. The display device manufacturing method according to claim 6, wherein the signal lines are arranged so that with respect to the pixel electrode, the signal line extends along a length equal to a quarter or more of an entire peripheral length of the pixel electrode, near the pixel electrode, and around the pixel electrode.

11. The display device manufacturing method according to claim 6, wherein the signal lines are arranged so that with respect to the pixel electrode, the signal line extends along a length equal to a quarter or more of an entire peripheral length of the pixel electrode, near the pixel electrode, and around the pixel electrode, and wherein the step of distributing the plurality of active element materials includes a step of randomly distributing the plurality of active element materials on the substrate.

12. The display device manufacturing method according to claim 6, wherein the step of substantially removing the undesired electrical continuity from the undesired active element materials includes a step of removing at least a portion of each of the undesired active element materials.

13. The display device manufacturing method according to claim 6, wherein the step of making each of the desired active element materials serve as the control element includes a step of making the desired active element material serve as a field-effect transistor.

14. The display device manufacturing method according to claim 13, wherein the rod-like semiconductor substance is silicon.

15. The display device manufacturing method according to claim 13, wherein a surface of the rod-like semiconductor substance is covered by an insulating film.

16. The display device manufacturing method according to claim 15, wherein the rod-like semiconductor substance is silicon and the insulating film on the surface is silicon oxide.

17. The display device manufacturing method according to claim 15, further comprising a step of connecting a film wiring member to an end of the at least one substrate.

18. A display device manufactured by the display device manufacturing method defined in claim 13.

19. The display device manufacturing method according to claim 6, wherein the step of substantially removing the undesired electrical continuity from the undesired active element materials includes a step of making each of the undesired active element materials serve as a field-effect transistor.

20. A display device manufactured by the display device manufacturing method defined in claim 6.

21. The display device manufacturing method according to claim 1, wherein the at least one substrate is a flexible substrate.

22. The display device manufacturing method according to claim 21, further comprising a step of connecting a film wiring member to an end of the at least one substrate.

23. A display device manufactured by the display device manufacturing method defined in claim 21.

24. The display device manufacturing method according to claim 1, wherein the at least one substrate is a substrate of an organic material.

25. A display device manufactured by the display device manufacturing method defined in claim 24.

26. A display device manufactured by the display device manufacturing method as defined in claim 1.

* * * * *